United States Patent
Koch et al.

(10) Patent No.: US 7,288,774 B1
(45) Date of Patent: *Oct. 30, 2007

(54) TRANSVERSE MAGNETIC FIELD VOLTAGE ISOLATOR

(75) Inventors: George R. Koch, Los Altos, CA (US); Douglas Masnaghetti, San Jose, CA (US); James Daniel Olson, San Mateo, CA (US); Jeffery Scott Coffer, Scotts Valley, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 231 days.

This patent is subject to a terminal disclaimer.

(21) Appl. No.: 10/811,308

(22) Filed: Mar. 26, 2004

Related U.S. Application Data (63) Continuation of application No. 10/114,022, filed on Mar. 29, 2002, now Pat. No. 6,746,566.

(60) Provisional application No. 60/339,487, filed on Dec. 11, 2001.

(51) Int. Cl.
*H01J 33/02* (2006.01)
*H01J 37/18* (2006.01)

(52) U.S. Cl. .............................. 250/441.11; 250/492.2; 250/491.1

(58) Field of Classification Search ...................... None
See application file for complete search history.

(56) References Cited

U.S. PATENT DOCUMENTS

| | | | |
|---|---|---|---|
| 2,920,235 A | 1/1960 | Bell et al. | |
| 3,600,065 A | 8/1971 | Law et al. | |
| 4,117,323 A | 9/1978 | Greer et al. | |
| 4,524,261 A | 6/1985 | Petric et al. | |
| 4,528,451 A | 7/1985 | Petric et al. | |
| 4,584,479 A | 4/1986 | Lamattina et al. | |
| 4,607,167 A | 8/1986 | Petric | |
| 4,818,838 A | 4/1989 | Young et al. | |
| 4,837,443 A | 6/1989 | Young et al. | |
| 4,956,024 A | 9/1990 | Dean et al. | |
| 5,103,102 A | 4/1992 | Economou et al. | |
| 5,928,426 A | 7/1999 | Aitchison | |
| 6,030,486 A | 2/2000 | Loewenhardt et al. | |
| 6,206,971 B1 | 3/2001 | Umotoy et al. | |
| 6,214,161 B1 | 4/2001 | Becker et al. | |
| 6,471,822 B1 | 10/2002 | Yin et al. | |
| 6,571,821 B2 | 6/2003 | Matte et al. | |

(Continued)

*Primary Examiner*—David A. Vanore
*Assistant Examiner*—James J. Leybourne
(74) *Attorney, Agent, or Firm*—Beyer Weaver LLP (57) ABSTRACT

An SEM wherein the entire imaging apparatus of the SEM is supported on air bearings. A multi-stage differentially pumped vacuum seal area provides a localized vacuum zone for wafer examination. A wafer leveling mechanism insures that the top surface of the wafer being examined is placed and maintained in a position level with the surface upon which the air bearing supported SEM rests. The SEM can move on its air bearings such that any portion of the wafer can be examined. A voltage-isolating passageway for providing high voltage isolation between a component maintained at high DC voltage and a component maintained at a substantially lower voltage is described. The voltage-isolating passageway incorporates a transverse magnetic field across its passageway. The voltage-isolating passageway includes at least two magnets that are positioned along opposite and exterior surfaces of the passageway. A semiconductive coating can be applied to the interior passageway surface.

9 Claims, 10 Drawing Sheets

U.S. PATENT DOCUMENTS

| | | |
|---|---|---|
| 6,710,354 B1 * | 3/2004 | Koch et al. ............ 250/441.11 |
| 6,746,566 B1 | 6/2004 | Olson et al. |
| 2001/0032591 A1 | 10/2001 | Carducci et al. |
| 2002/0185067 A1 | 12/2002 | Upham |

* cited by examiner

TRANSVERSE MAGNETIC FIELD VOLTAGE ISOLATOR

CROSS-REFERENCE TO RELATED APPLICATIONS

This application is a continuation of U.S. patent application Ser. No. 10/114,022, filed Mar. 29, 2002, now U.S. Pat. No. 6,746,566, entitled "Transverse Magnetic Field Voltage Isolator," which claims priority from U.S. Provisional Patent Application No. 60/339,487, filed Dec. 11, 2001 entitled "Transverse Magnetic Field Voltage Isolator," both of which are hereby incorporated by reference.

This application is related to U.S. Pat. No. 6,710,354, entitled "Scanning Electron Microscope Architecture and Related Material Handling System," the content of which is hereby incorporated by reference.

FIELD OF THE INVENTION

The present invention relates in general to scanning electron microscopes and specifically to the physical architecture of a scanning electron microscope and a material handling system used to support a scanning electron microscope with such an architecture.

BACKGROUND OF THE INVENTION

Scanning electron microscopes (SEMs) are known. The use of SEMs for inspecting various articles of manufacture at various points during their manufacture is also known. The high magnification and large depth of field available from a SEM makes it an invaluable tool in manufacturing. SEMs have found a particularly important place in the integrated circuit (IC) manufacturing process. ICs are typically fashioned on semiconductor wafers. These wafers are almost universally circular and a common diameter of the latest generation of such wafers is approximately 300 mm (12"). Many ICs, typically comprised of thousands of active devices such as transistors, are fabricated simultaneously on the wafer's surface. The small size of these semiconductor devices in such ICs as microprocessors requires an instrument with very high powers of magnification to view and inspect them adequately. Additionally, the various devices and other components that together form such a microprocessor are made from numerous different layers of materials. As a SEM offers both sufficient magnification and sufficient depth of field to inspect ICs both during and after processing, the SEM is the inspection tool of choice for the semiconductor industry.

The operating principles and design considerations of SEMs are known. SEMs use a focused beam of electrons to produce their images. An electron gun generates and accelerates electrons. These electrons then travel through one or more focussing elements and then strike an object being examined. Electrons are either reflected off the object into or knocked off the object into a detector. The pattern of reflected and scattered electrons forms the SEM's image of the object being examined. The use of an electron beam to image an object requires that the object being examined under the SEM be held within a vacuum, as the electron beam would otherwise be scattered by air and water molecules between the final beam focussing lens and the object.

The necessity of surrounding the object being examined by a high level vacuum (typical pressure levels within the sample chamber of a SEM are approximately $1\times10^{-5}$ Torr) usually restricts the number of object that can be examined in a given amount of time by the SEM, as the removal and introduction of an object into the vacuum chamber requires a non-trivial amount of time to first vent the chamber to ambient air pressure, remove the first object, insert the second object, reseal and then evacuate the sample chamber to the desired pressure level.

Within the semiconductor industry, the extremely delicate nature of a wafer undergoing processing makes the process of placing wafers into and removing them from the sample chamber of a SEM even more burdensome. In existing vacuum chamber designs, the wafer is inserted into the vacuum chamber, usually by means of a loadlock. A loadlock is a small chamber, usually only slightly larger than the sample, which is sealed on one end by a valve connecting it to the vacuum chamber and another valve at the second end connecting it to the atmosphere. Pumps and additional valves allow the pressure to be equalized within the loadlock to either the vacuum chamber or the atmosphere. A sample is introduced into one end of the loadlock, the atmospheric valve closed and the pressure within the loadlock reduced to equal the pressure in the vacuum chamber. When the pressure has been reduced sufficiently, the valve at the other end of the loadlock is opened and the sample moved into the vacuum chamber. Reversing this sequence of operation removes the sample from the vacuum chamber and returns it to the atmosphere.

In known SEMs, after the wafer has been placed in the loadlock and moved to the vacuum chamber, the entire wafer is subjected to the vacuum environment. The wafer is then transferred to a precision stage so that it may be placed and held under the SEM's electron beam. Upon completion of the examination or measurement, the wafer is transferred back to the loadlock, where it is returned to ambient pressure.

This known apparatus, although providing the necessary vacuum conditions for the SEM to function, suffers from a number of significant drawbacks. The vacuum chamber must be sufficiently strong to withstand the atmospheric pressure outside the chamber and sufficiently large to accept the numerous mechanisms which must be inside the chamber to transport the wafer between the loadlock and the SEM's examination stage. Every increase in the size and strength of a vacuum chamber increases its cost. The cycle time required to evacuate and vent the loadlock while exchanging wafers is significant. The mechanical wafer transport devices within the vacuum chamber must also be maintained and repaired on a periodic basis.

Eliminating the vacuum chamber and replacing it with a non-contacting graded vacuum seal, discussed herein as a staged-seal is known from other devices and equipment the must operate in a vacuum environment. See Petric et al., U.S. Pat. No. 4,524,261 in which a staged-seal is used in conjunction with an electron beam lithography system. The Petric patent is incorporated herein for all purposes.

In existing staged-seal apparatus used in semiconductor manufacturing, wafers being processed are held on a moveable x-y stage with a vacuum or electrostatic chuck. The staged-seal and electron beam column components are supported by a structure that bridges around the staged-seal and attached to a supporting base for the system. This supporting base is necessarily massive as it is required to maintain the precise mechanical gap between the wafer and the staged-seal vacuum seal against the forces created by the weight of the column and the vacuum load, both of which tend to reduce or close the gap.

The structure that supports the column must be extremely rigid to maintain the geometric relationships within the micron-level range while simultaneously providing sufficient space for the x-y stage to move over its entire range. The frame must consequently be relatively massive and the footprint of the entire system relatively large. These factors have discouraged the use of staged-seal apparatus.

It should be emphasized that for wafer examination under a SEM the gap between the objective lens of the SEM and the wafer under examination must be maintained with extreme accuracy. Typically, this gap is roughly 2 to 3 mm, but it must be maintained constant within a range of roughly 1 to 2 microns. Especially in the semiconductor wafer examination process, the complex and very fragile pattern formed on the surface of the wafer requires very precise location of the wafer's surface with respect to an X-Y examination stage upon which the wafer is typically located. The fragile nature of the wafer's surface and the depth-of-field requirements of the SEM both drive this requirement for very precisely locating the wafer's surface with respect to the SEM's objective lens. In use, the examination stage and the wafer must typically be co-planar within a range of a few microns.

Known apparatus to locate wafer precisely in this manner typically use complex and expensive actuators to adjust the wafer's height precisely so that the top surface of the wafer would be co-planar with the X-Y examination stage. Precision measuring sensors and a complex feedback control circuit continuously adjust the stage to hold the wafers in place.

The bulky and expensive vacuum stage, with its complex mechanisms to move and then place wafers being examined on an examination stage, and the complex equipment needed to maintain the wafer on the stage in proper co-planar relationship with the stage make SEM inspection of semiconductor wafers an expensive and time-consuming task. Even the replacement of the vacuum chamber with a staged-seal vacuum region has not greatly simplified the apparatus for or reduced the cost of SEM wafer inspection.

A SEM with improved wafer handling abilities would be a significant improvement in the semiconductor test and measurement industry.

BRIEF SUMMARY OF THE INVENTION

A first embodiment of the present invention comprises a SEM wherein the entire imaging apparatus of the SEM is supported on air bearings. Additionally, a multi-stage differentially pumped vacuum seal area provides a localized vacuum zone for wafer examination. A wafer leveling mechanism insures that the top surface of the wafer under examination is maintained in a position coplanar with the surface upon which the air bearing supported SEM rests.

In use, wafers to be examined are loaded into the wafer-leveling mechanism, which places and then holds their top surface flush with an examination table. The SEM is then moved on its air bearings and placed in appropriate position over the wafer. Any portion of the wafer can be examined simply by moving the SEM column in the appropriate direction.

Resting the imaging components of the SEM on air bearings and replacing the vacuum chamber of known SEMs with a multi-stage differentially pumped vacuum seal creates a highly localized vacuum zone that can be easily moved and relocated. Combined with the wafer leveling mechanism described herein, which quickly locates and then holds wafers flush with the examination table, this SEM permits rapid examination of the entire wafer surface without expensive robotic handling apparatus.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

Figure 1:
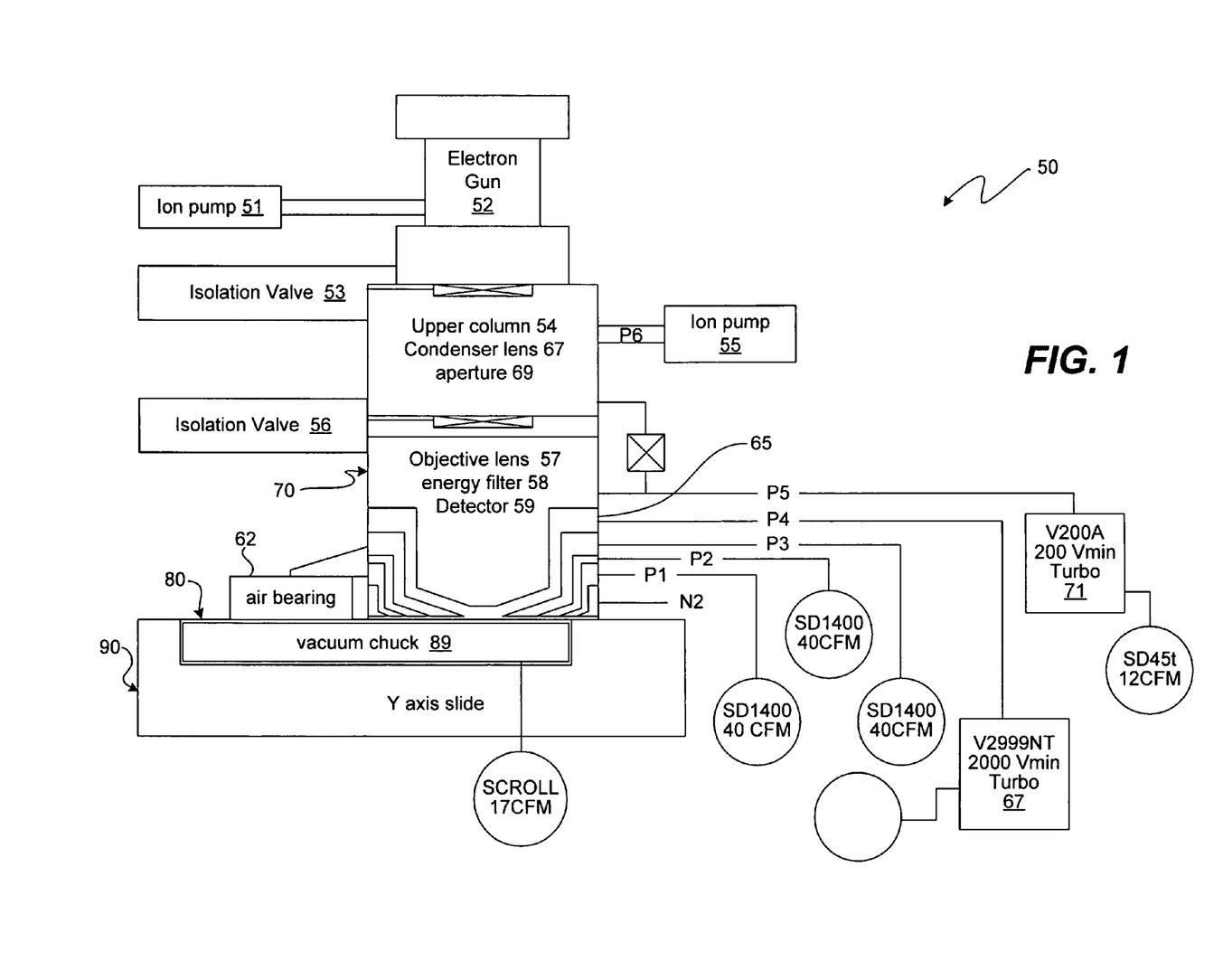
FIG. 1 is a schematic drawing of a SEM constructed according to a first embodiment of the present invention.

A scanning electron microscope (SEM) 50, comprising a first embodiment of the present invention, is shown in schematic form in FIG. 1. SEM 50 is supported on an array of air bearings 62.

SEM 50 is comprised of a first ion pump 51, which is coupled to electron gun 52. Ion pump 51 operates in a known manner to maintain the high level vacuum which is needed to insure proper operation of electron gun 52. Electron gun 52 generates a stream of electrons in a known manner and feeds them into upper column 54. Upper column 54 is coupled to ion pump 55. Ion pump 55 operates in a similar fashion to ion pump 51 and maintains the level of vacuum in upper column 54 necessary for proper SEM operation. Upper column 54 also contains a condenser lens 67 and aperture 69 for focusing the electron beam generated by electron gun 52 and transmitting it to the next stage of SEM 50.

Isolation valve 56 is coupled to SEM 50 between upper column 54 and objective stage 70 and is part of the vacuum maintenance system for the imaging components of SEM 50. Objective lens 57 focuses the electron beam after it exits aperture 69 and energy filter 58 restricts the energy levels of the electrons in the electron beam to a certain predetermined range. Detector 59 receives the electrons after they have struck the object under study and generates an image of the object under study in the SEM. For purposes of this specification only, SEM 50's electron generation and imaging components as described herein function in a known manner to generate images from wafers placed on the x-y stage 80 of examination table 90. The present invention should not be understood to operate with only a SEM of the particular type described herein. Any SEM could be adapted to function within the present invention.

Although the present invention is described in conjunction with a SEM in this embodiment, nothing herein should be taken to limit the present invention to functioning only with a SEM. Any column which uses charged particles in a vacuum environment, either as a beam or even as a cloud of such particles, could be used in conjunction with the present invention. For example, ion milling systems, particle beam deposition systems and the like could all be used in conjunction with the air bearings and staged vacuum seals described herein, as well as the wafer planarizing apparatus described herein.

Figure 2A:
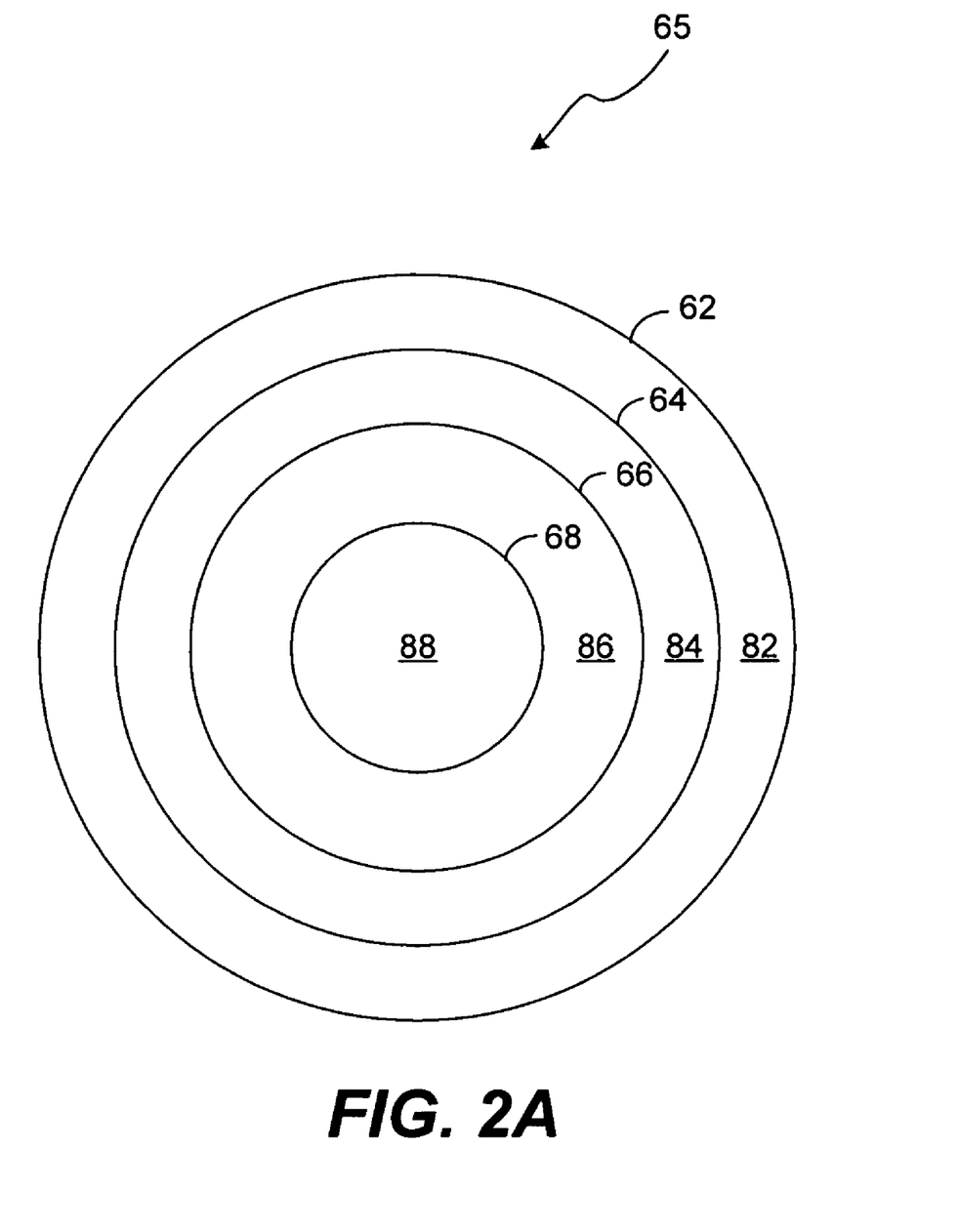
FIGS. 2*a*, 2*b* and 2*c* are, respectively, a top plan view, a cross-section of the staged-seal used in a preferred embodiment of the present invention and a graph of the pressure distribution from one vacuum stage to the next.
Figure 2B:
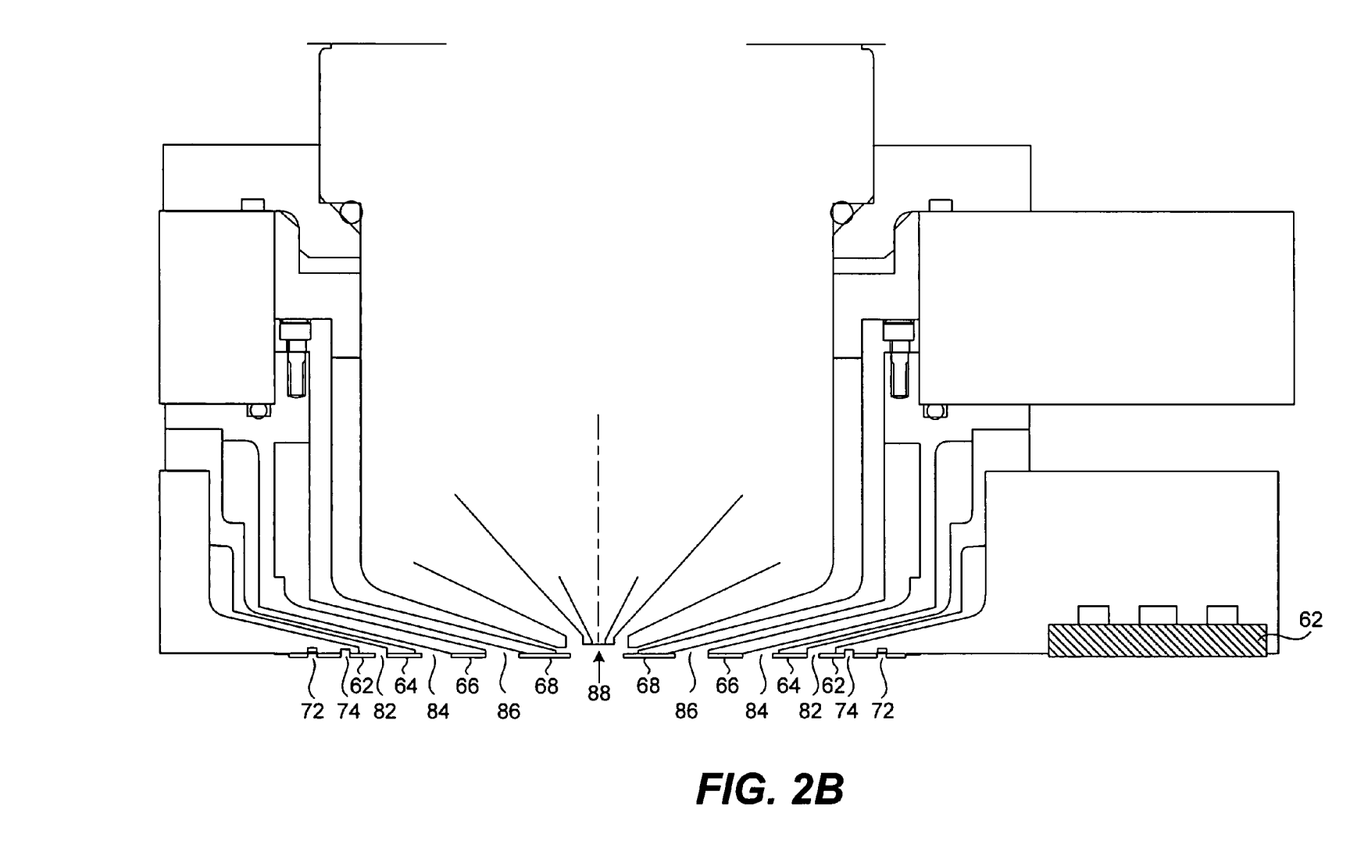

The final objective stage 70 of SEM 50 is surrounded by a multiple stage, non-contact vacuum seal 65. As shown in greater detail in FIGS. 2a and 2b, in this embodiment, seal 65 is comprised of four concentric metal rings 62, 64, 66 and 68. In this embodiment the rings are fabricated from anodized aluminum ($Al_2O_3$), although other materials such as titanium could be used. Proper attachment of these rings to the SEM ensures that their lower surfaces 75 are coplanar within approximately one micron. Vacuum stage 65 has four vacuum stages of decreasing pressure. Stage 82, the outer stage is evacuated by a standard vacuum pump to a pressure of roughly 1 Torr. Stage 84 is similarly evacuated by a standard vacuum pump to a pressure of approximately 0.1 Torr. Stage 86 is similarly evacuated by turbo-vacuum pump 67 (FIG. 1) to a pressure of 0.05 Torr. Stage 88, the fourth and innermost stage, is coupled to turbo-vacuum pump 71 (FIG. 1) that lowers the pressure of stage 88 to $5 \times 10^{-5}$ Torr. Overpressure vent 72 creates a ring of high pressure air around the entire set of vacuum seals. The overpressure prevents moisture from migrating into the inner vacuum zones. Ambient pressure vent 74 creates a ring of ambient air pressure between the overpressure created by vent 72 and first vacuum stage 82. The ambient pressure zone prevents the high pressure gas discharged from vent 72 from migrating further inward towards the vacuum zones and increasing the vacuum leakage rate.

Figure 2C:
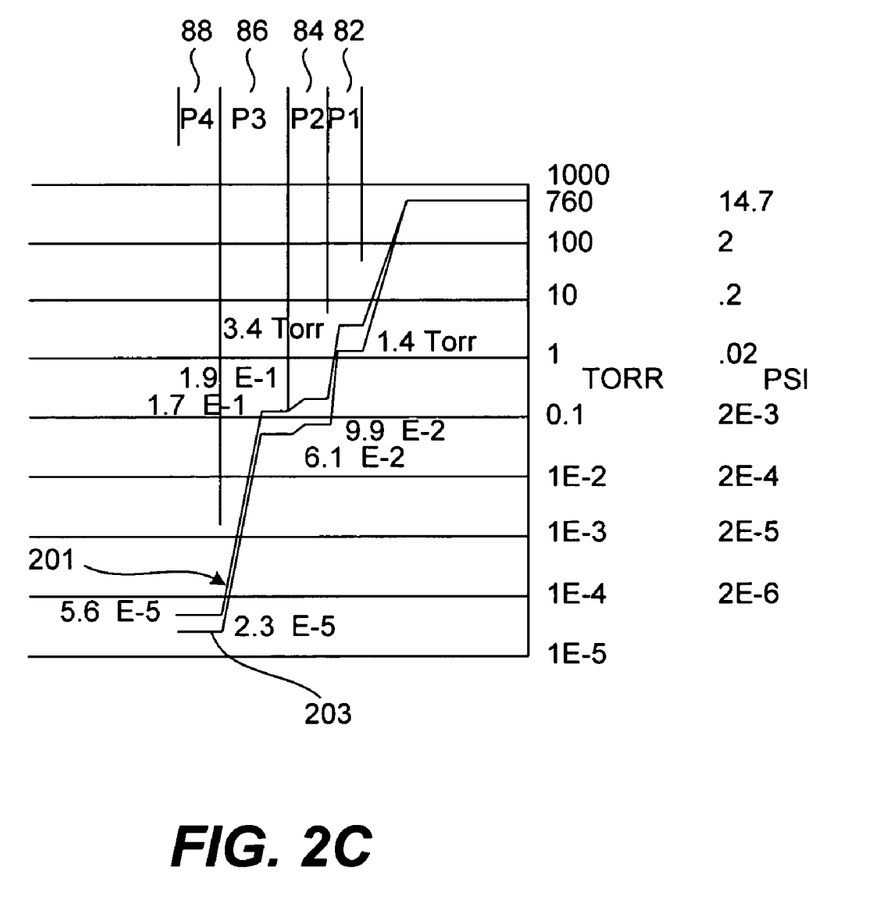

FIG. 2c provides a graph of the pressures realized using this first embodiment of the present invention. Two different traces 201 and 203 are provided. Trace 201 is taken when the center of inner vacuum pressure zone 88 is centered on the gap between the semiconductor wafer and the circular examination area 87 (see FIGS. 3a-3d). This curve represents the most severe test of the vacuum system, as the gap between the wafer and the edge of the examination area allows for the highest rate of air leakage in this embodiment. Trace 203 indicates the vacuum pressures when inner vacuum pressure zone 88 is centered on the semiconductor wafer being examined. Even in the worst case indicated by trace 201, the level of vacuum in zone 88 is sufficiently low as to present no difficulties for wafer examination and imaging.

Although four vacuum stages were used in this embodiment of the present invention, nothing herein should be taken to restrict the present invention to only using four stages. Few stages could be used if a greater pressure differential between each stage was acceptable, although larger vacuum pumps might be required for each stage. Similarly, more stages could be used, but with an associated disadvantage of increased mechanical complexity, as well as increased weight. The shape of the vacuum seals is also not definitive of the present invention. Although circular seals are easier to fabricate than some other shapes and match the shape of the semiconductor wafers, nothing herein requires that the seals be circular. Square, rectangular or even irregularly shaped seals could be used without departing from the teachings of the present invention.

To image semiconductor wafers properly, the present invention biases the wafers to a high negative voltage. Given the close clearance between the staged vacuum seals and the semiconductor wafers, the vacuum seals must be maintained at an equal negative voltage to prevent internal arcing that could destroy the SEM, the wafer or both. To provide this bias voltage, the system described in the earlier referenced co-filed application entitled, "Transverse Magnetic Field Voltage Isolator" is used. That specification is incorporated herein for all purposes.

The imaging components (i.e. at least comprising electron gun 52, upper column 54, objective lens 57, energy filter 58 and detector 59 also called herein the particle beam imaging column) of SEM 50 are supported by a plurality of air bearings 62 on examination table 90. Although FIG. 1 shows only a single air bearing 62, in the first preferred embodiment three separate air bearings 62, spaced approximately equidistantly around the SEM column, support the SEM column. The exact number of air bearings used to support the SEM column is determined by several factors such as the weight of the SEM column and ease of construction and operation. Although three air bearings are used in this first embodiment, different numbers and arrangements of the air bearings would be equally acceptable.

By supporting the SEM on air bearings and using a staged-seal vacuum system, the large and complex vacuum chamber typically used in conjunction with a SEM has been eliminated, along with the many mechanisms that were required within the vacuum chamber to move and position semiconductor wafers. The cost of maintaining these mechanisms is significant, as they require special low vapor pressure lubricants that have a fairly limited lifetime. In general, these mechanisms have historically been a major failure point in SEM systems. Their location within the vacuum chamber also makes them difficult to repair when they do fail, as the entire vacuum chamber must be vented to the atmosphere in order to gain access to the mechanisms. In the present invention, all wafer manipulating components function in an ambient air pressure environment and therefore require little in the way of specialized maintenance.

The air bearings and staged-seal vacuum gives an unusually solid but non-contacting connection between the SEM column and the wafer being examined. This leads to a stable, vibration resistant spacing between the column and wafer without the need for a massive support structure. The ease of examining any portion of the wafer should also be stressed, as the SEM column can be moved without friction on the air bearings.

FIGS. 3a through 3d show the operating components of the wafer handling system used in a preferred embodiment of the present invention and how they operate together to place and then hold semiconductor wafers in position to be examined by SEM 50 (FIG. 1).

Figure 3A:
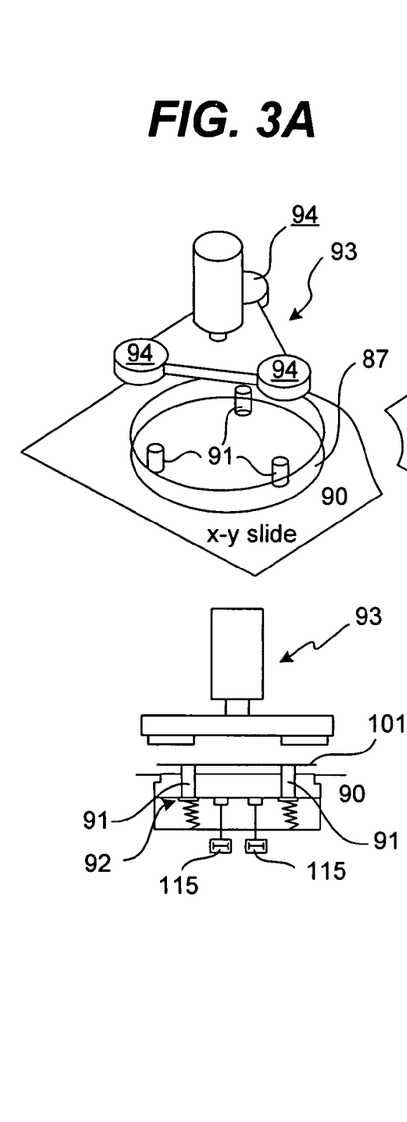
FIGS. 3*a*, 3*b*, 3*c* and 3*d* are a series of perspectives and related cross-sections of a wafer leveling apparatus as used in a preferred embodiment of the present invention.

As shown in FIG. 3a, examination table 90 has a circular examination area 87 cut into it. The diameter of examination area 87 is equal to that of the semiconductor wafers that will be examined using the present invention, to within approximately 250 microns. The gap between the circular examination area 87 and the semiconductor wafer must be kept quite small so that the vacuum pumps can maintain the desired pressure despite the leakage caused by the gap. An advantages of the present invention is that the semiconductor wafer can be examined from edge to edge across its entire surface after it has been placed in circular examination area 87 and brought into a co-planar relationship with the surface of the table. The gap must therefor be small enough so that the air bearings and staged vacuum seals can pass from the wafer to the examination table without encountering a discontinuity.

A vacuum chuck 89, a plurality of lifter assemblies 91 and a plurality of vacuum chuck clamps 115 are located within the well defined by circular examination area 87. A separate leveling device 93 is comprised of three air bearings 94 mounted rigidly in a frame so that their active bearing surfaces are precisely co-planar and arranged in an equilateral triangular pattern centered on the axis of the wafer being examined. Although leveling device 93 is shown with three air bearings 94, other numbers and arrangements of air bearings would work equally well. As shown most clearly in FIG. 3c, the outer portions of air bearings 94 extend past the edge of circular examination area 87 and the inner portions of air bearings 94 ride upon the surface of the wafer being examined.

The purpose of vacuum chuck 89, lifter assemblies 91, vacuum chuck clamps 115 and leveling device 93 is to place wafer 101 in a position precisely co-planar with the top surface of examination table 90 and maintain wafer 101 in that position. FIG. 3a shows wafer 101 resting on top of lifter assemblies 91. Vacuum chuck 89 is spring-loaded by a shoulder 92 in lifter assemblies 91 so that in the unloaded state, its vacuum face is slightly higher than the top surface of examination table 85. Lifter assemblies 91 are spring-loaded so that their ends are slightly higher that the vacuum face of vacuum chuck 89 in the unloaded state. When wafer 101 is initially place on lifter assemblies 91, the lower surface of wafer 101 is above and not in contact with the vacuum face of vacuum chuck 89. Although the construction and operation of vacuum chuck clamps 115 will be described subsequently in greater detail, in this unloaded state the clamps are unlocked and free to move.

Figure 3B:
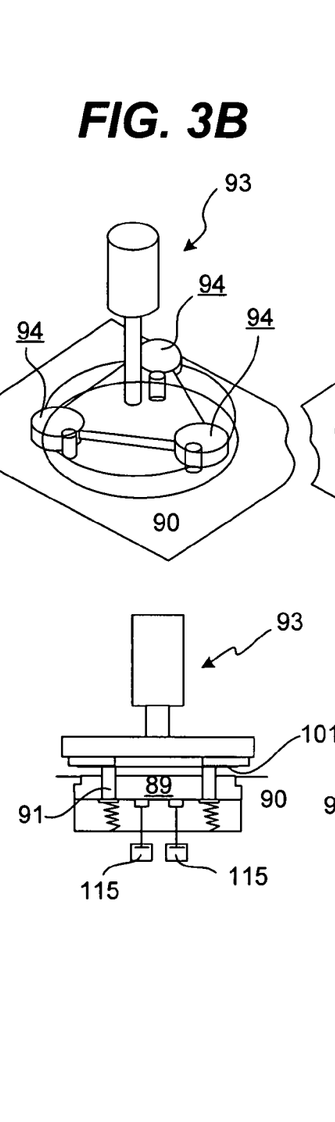
Figure 3C:
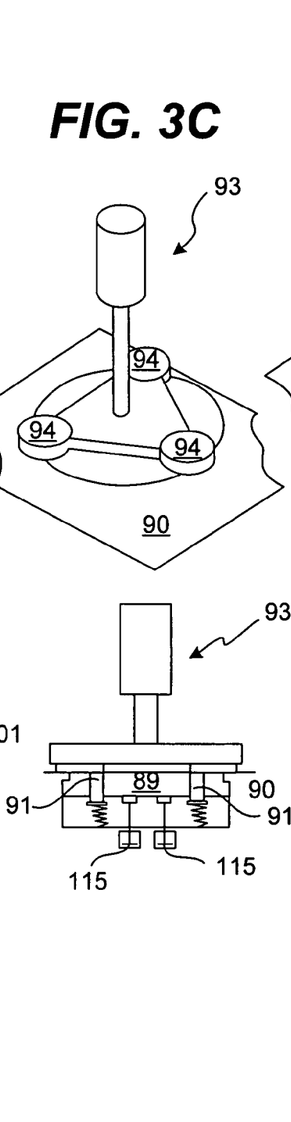

To load wafer 101, vacuum chuck 89 is positioned under leveling device 93. A robot places wafer 101 on lifter assemblies 91 and then withdraws, leaving wafer 101 resting on lifter assemblies 91 above vacuum chuck 89. Vacuum chuck clamps 115 remain unlocked and spring biased to its extended position at this time. As shown in FIGS. 3b and 3c, leveling device 93 is used to clamp wafer 101 to lifter assemblies 91 and then to press down on wafer 101 and, in turn, on lifter assemblies 91, vacuum chuck 89 and vacuum chuck clamps 115 until leveling device 93 is stopped by contact with the top surface of examination table 90. When this contact occurs, the top surface of wafer 101 is co-planar with the top surface of examination table 90 to within a very small tolerance. As a gas film exists between air bearings 94 and the top surface of wafer 101, no mechanical contact occurs with the top surface of wafer 101 during this leveling operation. With wafer 101 still clamped between leveling device 93 and vacuum chuck 89, the area beneath wafer 101 is evacuated, which clamps wafer 101 to vacuum chuck 89.

Figure 3D:
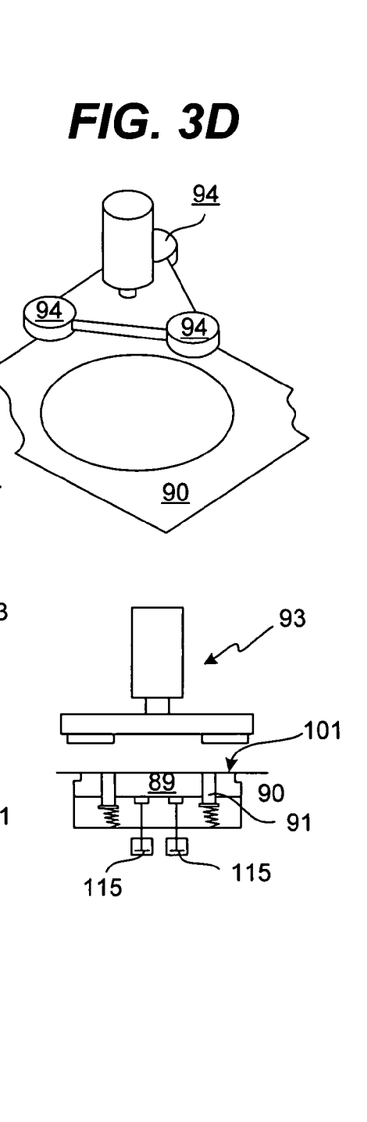

Vacuum chuck 89 is then clamped solidly into position by locking vacuum chuck clamps 115. As shown in FIG. 3d, lifting assemblies 91 are compressed and leveling device 93 is withdrawn, leaving wafer 101 in its co-planar position with the top of examination table 90. By locking vacuum chuck 89 into position, vacuum chuck clamps 115 also maintain lifter assemblies 91 in their compressed state.

To unload wafer 101, leveling device 93 is brought over and into gas contact with the top surface of wafer 101. Vacuum chuck clamps 115 are then released. Next, the vacuum in vacuum chuck 89 is released. Leveling device 93 is then removed. Spring forces from both lifter assemblies 91 and vacuum chuck clamps 115 raise vacuum chuck 89 above the top surface of examination table 85 and wafer 101 above the face of vacuum chuck 89.

Lifter assemblies 91 are illustrated in FIGS. 3a through 3d as spring loaded devices. Various arrangements of springs would function adequately in these assemblies to perform the requisite locating and holding of the wafer and vacuum chuck. The use of a purely mechanical device is necessitated by the operating environment of the SEM. The use of any electromechanical device such as a solenoid or other similar electrically controlled actuator is not permitted, as the electromagnetic fields that such a device would generate could distort the electron beam in the SEM, degrading or destroying its imaging capability.

Figure 4:
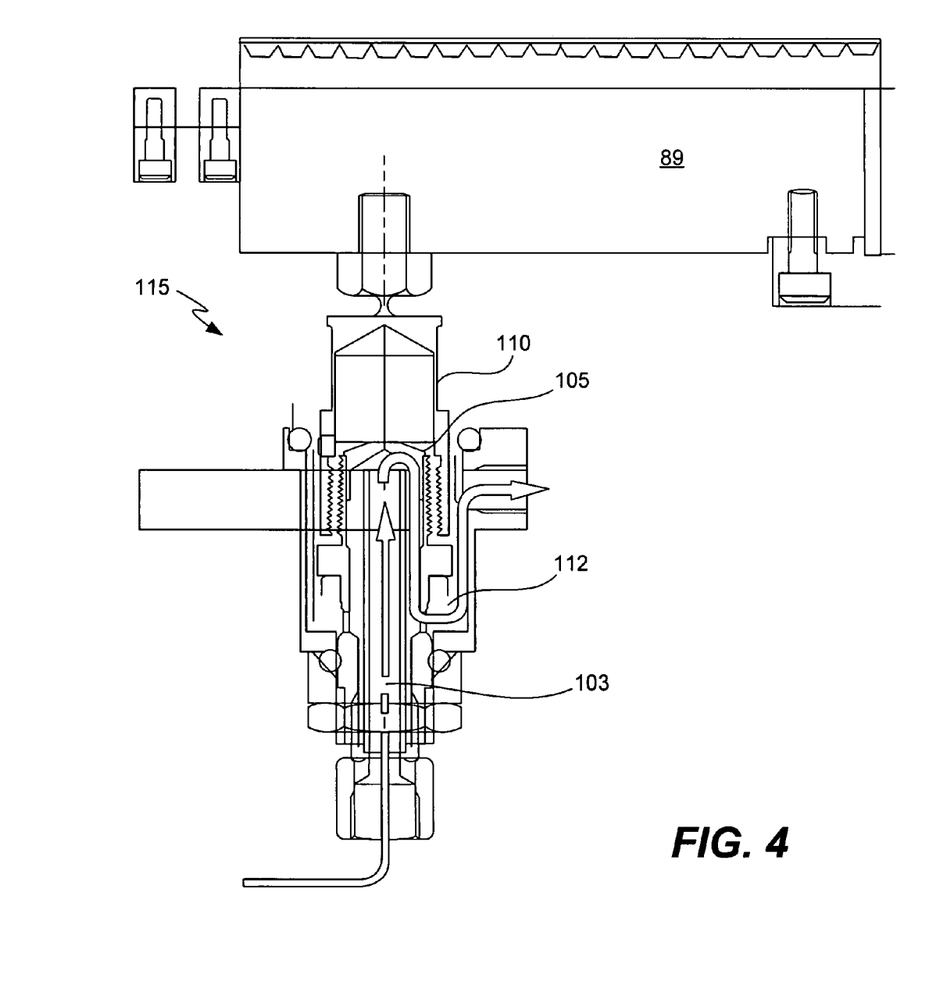
FIG. 4 is a cross sectional drawing of a section of the wafer leveling apparatus.

FIG. 4 is a cross-section of a vacuum chuck clamp 115. In this embodiment, vacuum chuck clamp 115 comprises a piston 110 within a cylinder filled with a metal alloy that melts at a relatively low temperature. Piston 110 with side flange 111 rests atop inner column 105. An annular space defined by the outer wall of column 105 and the inner surface of flange 111 is filled with the metal alloy, which is typically a bismuth alloy. Water channel 107 through the center of column 105 vents to an external drain 112. An internal spring (not shown) biases vacuum chuck clamp 115 to its extended position at the beginning of the loading process. Prior to the leveling process previously described, hot water is flowed through channel 107. The hot water melts the metal alloy, allowing vacuum chuck clamp 115 to be compressed. At the completion of the loading operation, hot water flow is halted, cold water flow begins and, as the alloy solidifies, vacuum chuck clamp 115 becomes locked into the desired position. During unloading operations, hot water flow is resumed, melting the alloy. Once the alloy has melted, vacuum chuck clamp 115 is free to move into an extended position under spring bias when wafer 101 is to be unloaded.

The present invention also pertains to techniques for increasing the breakdown threshold voltage at which avalanche ionization can occur within low-pressure environments. One specific implementation of the invention involves providing high voltage isolation between a vacuum chamber and a vacuum pump in pressure range of approximately 1 mill-Torr-1 Torr with little or no current load on the voltage source and without impeding the flow of gas from a vacuum chamber to a vacuum pump. The invention creates a transverse magnetic field across a gas passageway, which reduces the potential energy of charged particles (e.g., electrons) passing through the passageway. The reduction in electron potential energy reduces the energy of collisions between electrons and molecules and therefore the likelihood of avalanche ionization.

Figure 5:
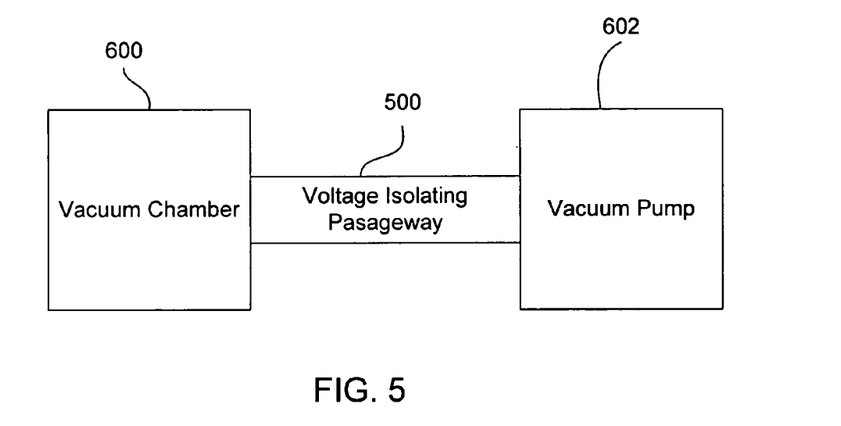
FIG. 5 illustrates a block diagram showing the basic concept wherein voltage-isolation passageway system connects two components.

FIG. 5 illustrates a block diagram showing the basic arrangement in which a voltage isolating passageway system 500 of the present invention can be utilized. In FIG. 5, passageway system 500 connects two components 600 and 602. In a specific embodiment, component 600 is a vacuum chamber and component 602 is a vacuum pump that pumps down the pressure of vacuum chamber 600 through passageway system 500. Various devices can operate within vacuum chamber 600. For example, a scanning electron microscope or a semiconductor-manufacturing device can operate within vacuum chamber 600. Typically, the device within vacuum chamber 600 is biased at a very high voltage while vacuum pump 602 is grounded at substantially 0 Volts. For example, a typical electron microscope may operate at −7000 Volts. Voltage-isolating system 500 acts to substantially prevent current flow between components 600 and 602 so that the components do not short-circuit each other.

Figure 6:
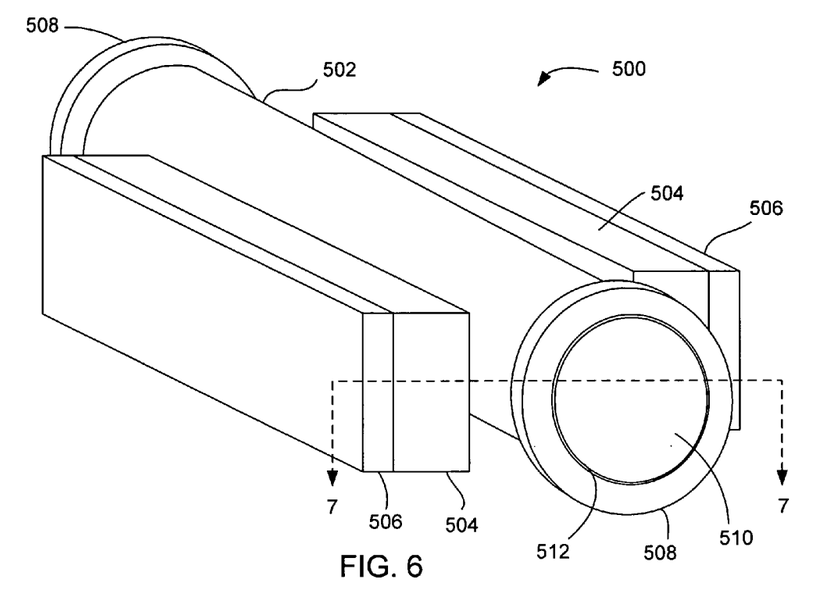
FIG. 6 illustrates a perspective view of a voltage-isolating passageway system according to one embodiment of the present invention.
Figure 7:
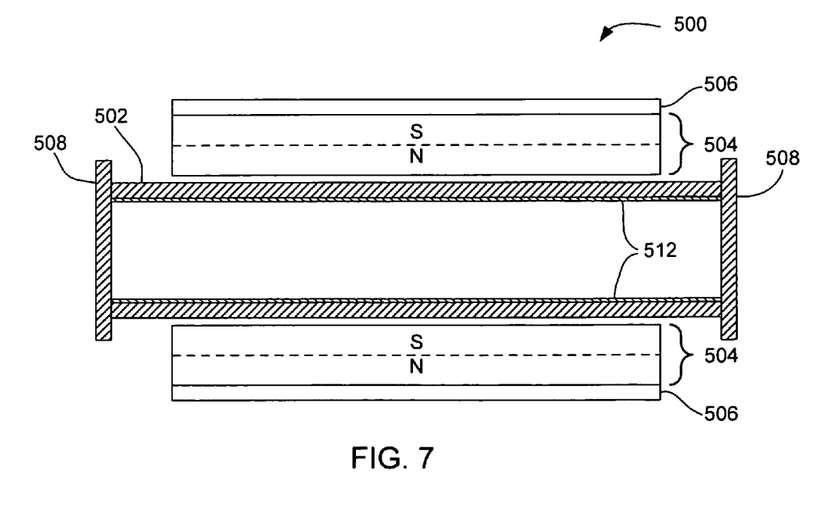
FIG. 7 illustrates a cross-sectional view of system along line 7-7 in FIG. 6.

FIG. 6 illustrates a perspective view of voltage isolating passageway system 500 of FIG. 5, according to one embodiment of the present invention. FIG. 7 illustrates a cross-sectional view of system 500 along line 7-7 in FIG. 6. Passageway system 500 includes a passageway 502 and two magnets 504 positioned about the outer walls of passageway 502. Passageway 502 has a seal 508 at each opening 510. Pole pieces 506 are attached to the outside surfaces of magnets 504. The inner surface of passageway 502 is coated with a semi-conductive coating 512.

Passageway 502 is a tube through which gas can travel. Seals 508 help maintain the vacuum created within the chambers connected by passageway 502. Seals 508 can be, for example, O-ring seals. Passageway 502 can be of a variety of shapes even though, for exemplary purposes, passageway 502 is shown to have a tubular configuration. Passageway 502 is preferably made of electrically non-conductive materials such as polycarbonate materials.

As seen in FIG. 7, magnets 504 are bar magnets that are oriented so that their poles face the same direction. In this orientation, opposite poles of each magnet 504 face each other and across passageway 502. The north and south poles that face each other across passageway 502 create a magnetic field in the direction transverse to the length of passageway 502. As will be describe in more detail below, the transverse magnetic field will reduce the potential energy of free electrons moving through passageway 502 since it applies a force that is orthogonal to the electron's direction of movement. Magnets 504 can be a single bar magnet having a length equal to a substantial length of passageway 502 as shown in FIG. 7, or each magnet 504 can be substituted with a plurality of individual smaller magnets. Of course, when individual magnets are used, their poles must still be oriented so that opposite poles face each other across passageway 502. Magnets 504 are permanent magnets, however, electrically powered magnets could also be used. Magnets 504 can be made of rare earth materials. In general, the length and strength of the magnetic field dictate the amount of voltage isolation that can be achieved. Longer fields and stronger magnets both produce higher levels of voltage isolation. For particular applications that require less voltage isolation, shorter magnets can be used. For the application of an electron microscope, magnets 504 create a transverse magnetic field of at least 2650 Gauss. Magnetic fields stronger than 2650 Gauss can provide higher levels of voltage isolation, thereby allowing isolated components to operate at voltages greater than 7000 Volts DC.

Pole pieces 506 are attached to the outer surface of magnets 504 in order to direct the magnetic field direction in the transverse direction with respect to the length of passageway 502. Pole pieces can be formed of iron or other suitable materials and alloys.

Semi-conductive coating 512 has a very high resistance that keeps any current flow between each end of passageway 502 to a minimum. Coating 512 gives passageway 502 an end-to-end nominal resistance of approximately 115 Mega Ohms. This corresponds to a nominal surface resistance of 60 Mega Ohms square. Preferably, coating 512 is a mixed metal oxide in an acrylic polymer carrier. The acrylic polymer carrier prevents evaporation and contamination of coating 512. The end-to-end resistance of passageway 502 can vary depending upon the characteristics of coating 512. For instance, the use of various materials can affect the resistance of coating 512. Semi-conductor coating 512 can be applied to the inner surface of passageway 502 by spray application techniques.

In an embodiment of system 500 in which passageway 502 is used to connect a vacuum chamber and a vacuum pump, passageway 502 is a polycarbonate tube that is approximately six inches long, having an outer diameter of 1.25 inches, and having a wall thickness of ⅛ inches. The magnets 504 that are mounted to passageway 502 are 12 individual magnet pieces, that are 1"×1"×0.5" in dimension, 35 grade, and formed of neodymium rare earth magnets. Each of the 12 magnets are arranged into two bar magnets wherein each of the bars are placed on one side of passageway 502. Each of the bars are created by attaching six magnets to a 6"×1"×⅜" piece of C1018 cold-rolled piece of steel. This embodiment of voltage isolation system 500 can effectively increase the threshold breakdown voltage, at any pressure, thereby allowing a high voltage system to operate at higher voltages.

Figure 8:
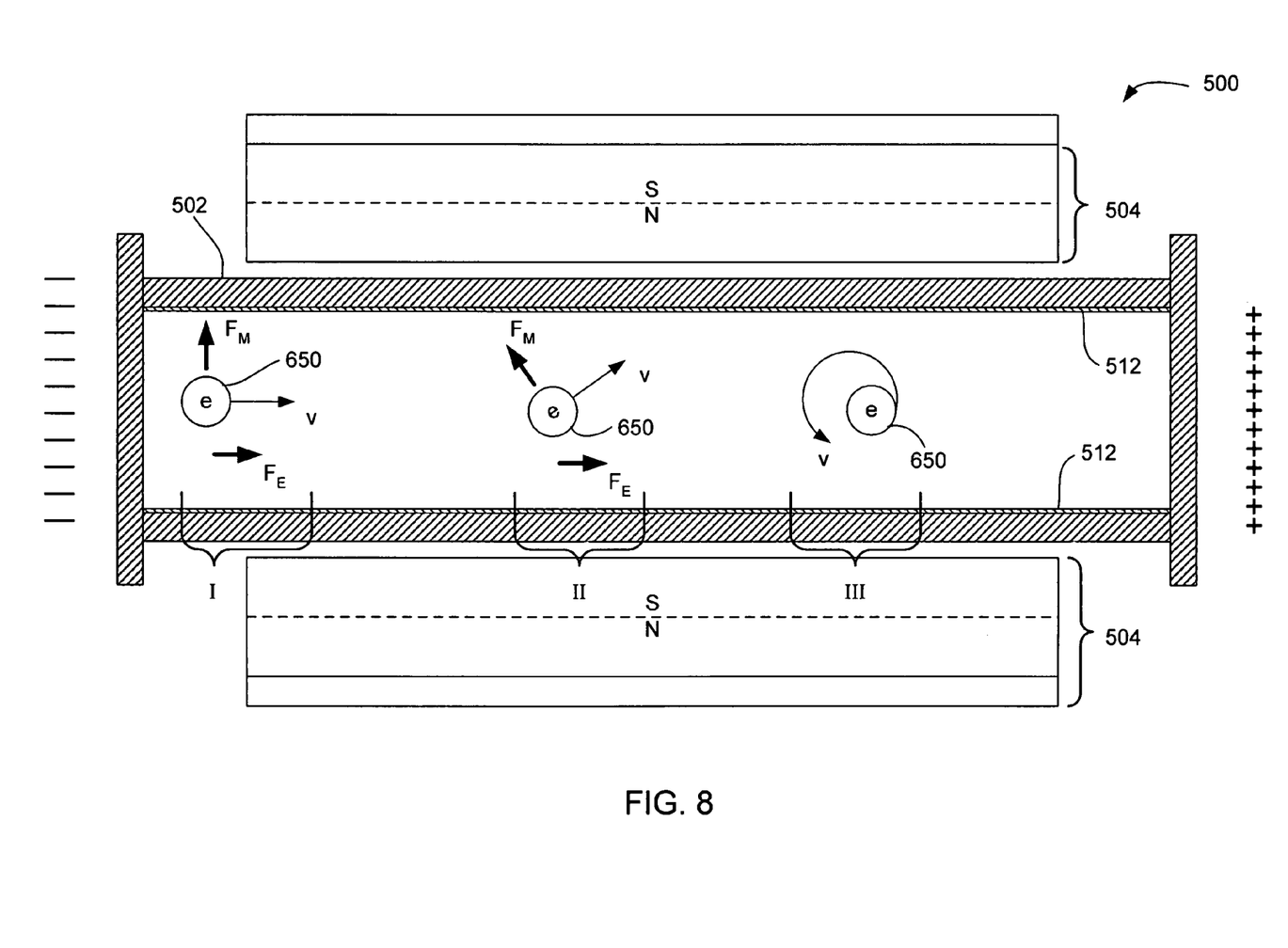
FIG. 8 presents an enlarged cross-sectional view of voltage-isolating passageway system to describe how the transverse magnetic field reduces the potential energy of the charged particles that pass through the passageway.

FIG. 8 presents an enlarged cross-sectional view of voltage-isolating passageway system 500 to describe how the transverse magnetic field reduces the potential energy of the charged particles that pass through the passageway. FIG. 8 represents a passageway system 500 wherein the left side is connected to a component that is maintained at a high negative DC voltage and the right side is connected to a component that is maintained at a ground potential. For example, the left side is connected to an electron microscope and the right side is connected to a vacuum pump. The negative and positive signs on each side of passageway 502 represent the negative and ground potentials. Both the suction of the pump and the electrical force, $F_E$, caused by the electrical bias across the passageway 502, accelerate free electrons along the longitudinal axis and from the left to the right end of passageway 502. These forces cause electrons to travel at very high speeds, and therefore, to have very high potential energies. Again, avalanche ionization is caused when these electrons begin to collide and break apart molecules, thereby creating more high energy electrons that will break apart additional molecules.

A single electron 650, progressing through three basic stages (I, II, and III), is shown within passageway 502 to describe how the transverse magnetic field, $F_M$, reduces the potential energy of the traveling electrons. Stage I, represents the initial stage in which electron 650 enters passageway 502 and is accelerated towards the right end of passageway 502 such that it has a velocity, v. Upon entering passageway 502, electron 650 has a velocity, v, that is substantially in the direction of the passageway's longitudinal axis. However, as shown in stage II, as electron 650 enters into the transverse magnetic field created by magnets 504, the force of the magnetic field, represented by $F_M$, accelerates electron 650 in a direction orthogonal to velocity, v. The direction of the magnetic field is represented by $F_M$. Since, the magnetic force on an electron remains orthogonal to the direction of the moving electron, magnetic force $F_M$ causes electron 650 to move in a cyclical path while traveling through passageway 502. Stage III represents the cyclical path in which electron 650 travels, as caused by $F_M$. While travelling in the cycloidic path, the electron is accelerated for one half of the cycle and decelerated for the other half, with respect to the longitudinal axis of passageway 502. As a result, the velocity of electron 650, and therefore its potential energy is greatly reduced. Collisions with the spinning electron 650 now occur at greatly reduced energy. This reduces the possibility that a collision between electron 650 and a molecule would result in the beginning of avalanche ionization.

Semi-conductive coating 512 also detracts from avalanche ionization conditions by absorbing electrons that make contact with the coating, thus reducing the amount of potential energy available. Note that the transverse magnetic force increases the number of electrons that will make contact with coating 512 by forcing electrons towards one side of the inner surface of passageway 502. Effectively, semi-conductive coating 512 reduces the total number of free electrons within the gas, thereby reducing the number electron/molecule collisions. Semi-conductive coating 512 provides a high impedance and direct current path for the absorbed electrons in which the electrons can be conducted toward the ground potential in a controlled and predictable manner. The impedance of coating 512 is sufficiently large that the flow of current through passageway 502 causes only a negligible drop in voltage between the components on either end of system 500.

Voltage-isolating system 500 is effective with or without semi-conductive coating 512. However, for significantly higher voltage isolation, it is preferable to utilize both the magnets 504 and the semi-conductive coating 512. In some embodiments, passageway 502 can be extruded with a conductive doping so that the need to coat the passageway with the semi-conductive coating is eliminated.

Depending upon the voltage isolation and pressure requirements of specific implementations, the length and shape of the passageway can be adjusted accordingly. Also, the field strength and the arrangement of the magnetic poles can be positioned to obtain different levels of voltage isolation.

The effectiveness of the voltage-isolation passageway system of the invention allows the passageway connecting a vacuum chamber and a vacuum pump to be relatively short in length and presents no significant impedance of the flow of the gas. This is particularly advantageous in conditions where space, for example, in a manufacturing plant, is at a premium.

Figure 9:
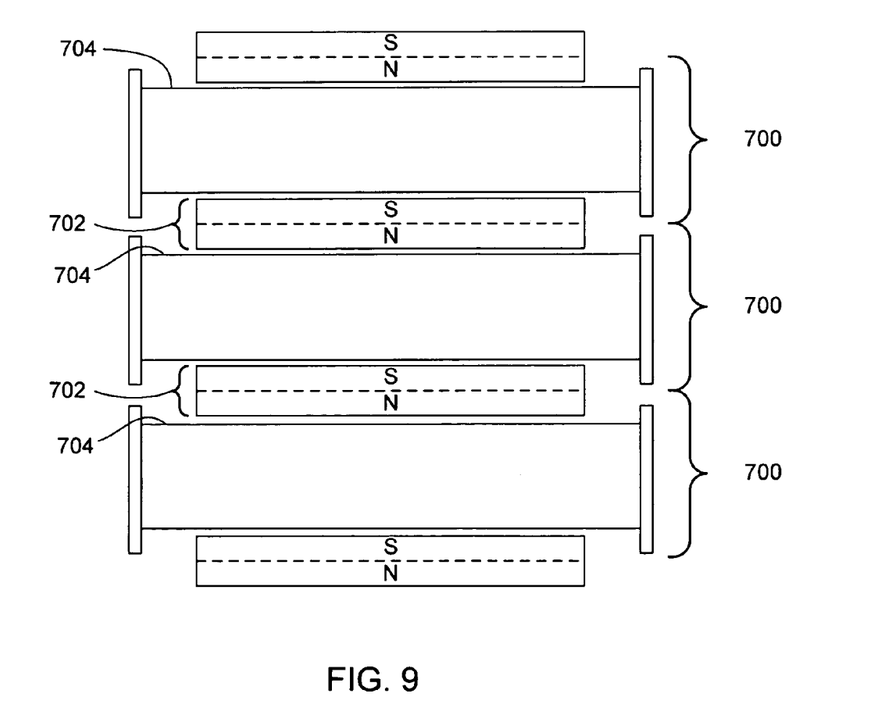
FIG. 9 illustrates an alternative embodiment of the present invention in which three voltage-isolation passageway systems are aligned in parallel.

FIG. 9 illustrates an alternative embodiment of the present invention in which three voltage-isolation passageway systems 700 are aligned in parallel. The arrangement in FIG. 9 is useful in systems in which different levels of low-pressure environments are maintained during the operation of a vacuum system. For instance, each passageway 704 can connect a respective vacuum pump to a respective vacuum chamber. In the parallel arrangement, the north and south poles of each magnet 702 are positioned to face adjacent passageways 704. With this arrangement, it is no longer necessary to have a pole piece for each magnet.

Figure 10:
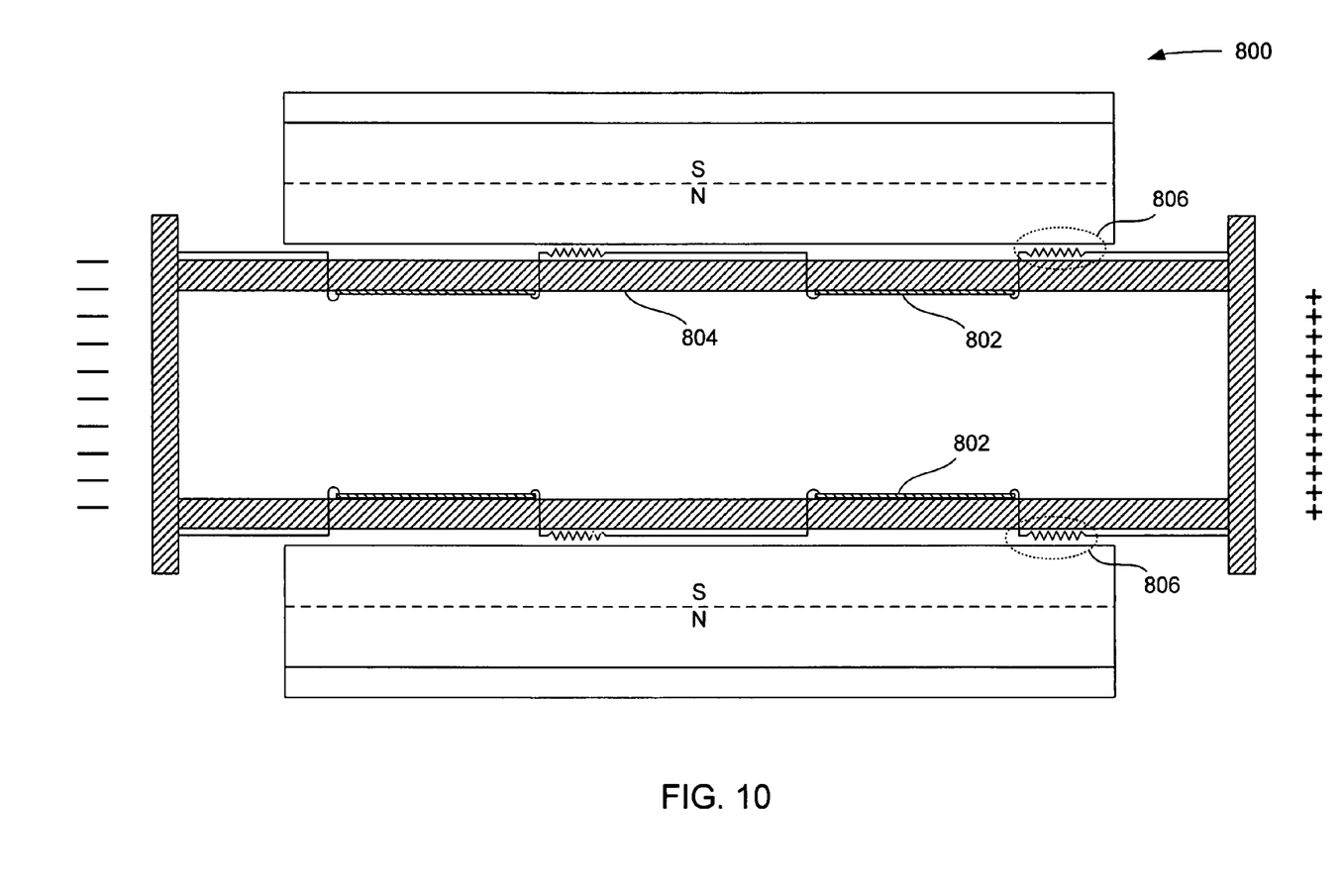
FIG. 10 illustrates a voltage isolation passageway system according to another alternative embodiment of the invention.

FIG. 10 illustrates a voltage isolation passageway system 800 according to another alternative embodiment of the invention. System 800 has a series circuit of discrete strips of semi-conductive coating 802 on the inner surface of passageway 804 that are connected to external resistors 806. The series circuitry connects the opposite ends of passageway 502 such that the voltage drop occurs in measured amounts along the length of passageway 502 as determined by resistors 806. As with the semi-conductive coating that covers the entire length of the passageway, the discrete strips of semi-conductive coating 802 also collect free electrons so to remove them from the flowing gas. In this configuration the bias potential can be actively monitored along the length of the pathway.

An alternative application of the invention utilizes a magnetic field to isolate selected regions of a substrate from plasma formed through avalanche ionization. This application relates to the industrial plastics industry, which uses plasma as a means to modify the surface of a substrate in order to enhance the bonding of an unlike and or incompatible material to their product, i.e. paint on plastic, Teflon coating on silicon rubber, ect. In some cases it is necessary to shield a portion of the whole substrate from the effects of the plasma chemistry. A magnetic field could be easily adapted to any shape and likewise and be positioned to prevent a plasma from being formed within its field, thus creating a plasma shadow zone to protect sensitive areas of the substrate from the surface modifications due to direct exposure to plasma. This process is typically achieved with masking material that is costly and labor intensive.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A particle beam device which operates upon a test subject, wherein at least a portion of the particle beam device is maintained in a vacuum, the particle beam device comprising at least:

a particle generator;

at least a first particle focusing device, the particle generator and the at least first particle focusing device together being formed into a first particle beam column;

a plurality of air bearings to support the particle beam column and to permit the particle beam column to move in a nearly frictionless manner across a top surface of a first support table;

a sample holding station located within the top surface of the first support table, the sample holding station holding at least a first surface of a test object in an essentially co-planar relationship with the top surface of the first support table, wherein the sample holding station comprises at least a well in the top surface of the first support table for receiving the test object therein, and wherein the sample holding station further comprises a plurality of lifter assemblies and a chuck, the lifter assemblies in a first extended position receiving the test object and in a second, compressed position holding the test object in proximity to the chuck so that the chuck can hold the test object, the compressed position being such that the top surface of the test object is held in a co-planar relationship with the top surface of the first support table; and an air bearing leveling tool for placing the test object into the second, compressed position, the air bearing leveling tool having a plurality of air bearings which are applicable to the top surface of the test object to thereby force the test object and the lifter assemblies into the second, compressed position.

2. The particle beam device of claim 1 wherein a staged vacuum seal is fitted to the particle beam column between the at least first particle focusing device and the top surface of the first support table, the staged vacuum seal creating a plurality of concentric, reduced pressure zones around the first particle beam column.

3. The particles beam device of claim 2 wherein the staged vacuum seal is comprised of a plurality of nested circles, the innermost reduced pressure zone having a circular cross section and succeeding reduced pressure zones have a torroidal cross section surrounding the innermost circular reduced pressure zone.

4. The particle beam device of claim 3 wherein the innermost circular reduced pressure zone has a first predefined air pressure that permits operation of the particle beam within the innermost circular reduced pressure zone.

5. The particle beam device of claim 4 wherein each succeeding torroidal reduced pressure zone has an air pressure greater than the preceding reduced pressure zone.

6. The particle beam device of claim 1 wherein the test object comprises a semiconductor wafer of first predetermined diameter and the well of the sample holding station is circular and has a second predetermined diameter at least equal to the first predetermined diameter.

7. The particle beam device of claim 6 the plurality of air bearings are fixed into a rigid frame, an active, gas bearing surface of each of the air bearings being held in a co-planar relationship with all the other active, gas bearing surfaces of the air bearings, the frame having a predetermined diameter greater than the semiconductor wafer's diameter, the active, gas bearing surfaces being applied to the top surface of the semiconductor wafer and forcing the wafer and the lifter assemblies into the second, compressed position during operation of the particle beam device.

8. The particle beam device of claim 7 wherein the lifter assemblies are filled with a low melting point metal alloy, heat being applied to the lifter assemblies when the lifter assemblies are required to move from the first position to the second position and when the lifter assemblies are required to move from the second position to the first position, heat being removed and the metal alloy solidifying, fixing the lifter assemblies into position at all other times.

9. The particle beam device of claim 1 wherein the test object comprises a semiconductor wafer of first predetermined diameter and the well of the sample holding station is circular and has a second predetermined diameter at least equal in size to the first predetermined diameter.

* * * * *